United States Patent
Yuan et al.

(10) Patent No.: US 8,422,276 B2
(45) Date of Patent: Apr. 16, 2013

(54) SPACER STRUCTURE IN MRAM CELL AND METHOD OF ITS FABRICATION

(75) Inventors: Jun Yuan, Fremont, CA (US); Liubo Hong, San Jose, CA (US); Mao-Min Chen, San Jose, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 259 days.

(21) Appl. No.: 12/930,955

(22) Filed: Jan. 20, 2011

(65) Prior Publication Data

US 2011/0117677 A1    May 19, 2011

Related U.S. Application Data

(62) Division of application No. 11/290,763, filed on Nov. 30, 2005, now Pat. No. 7,880,249.

(51) Int. Cl.
*G11C 11/00* (2006.01)

(52) U.S. Cl.
USPC ............ 365/158; 365/148; 365/171; 977/935

(58) Field of Classification Search ............... 365/48, 365/55, 62, 66, 74, 78, 80–93, 100, 130, 365/131, 148, 158, 171–173, 209, 213, 225.5, 365/230.07, 232, 243.5; 257/295, 421, 422, 257/427, E21.665, E27.006; 438/3; 977/933–935
See application file for complete search history.

(56) References Cited

U.S. PATENT DOCUMENTS

| | | | |
|---|---|---|---|
| 6,174,737 B1 | 1/2001 | Durlam et al. | |
| 6,475,857 B1 | 11/2002 | Kim et al. | |
| 6,555,858 B1 | 4/2003 | Jones et al. | |
| 6,703,654 B1 | 3/2004 | Horng et al. | |
| 6,713,802 B1 | 3/2004 | Lee | |
| 6,783,995 B2 | 8/2004 | Hineman et al. | |
| 6,806,096 B1 | 10/2004 | Kim et al. | |
| 6,852,550 B2 | 2/2005 | Tuttle et al. | |
| 6,881,351 B2 | 4/2005 | Grynkewich et al. | |
| 6,911,156 B2 | 6/2005 | Grynkewich et al. | |
| 6,969,895 B2 * | 11/2005 | Han et al. | ...... 257/421 |
| 6,985,384 B2 | 1/2006 | Costrini et al. | |
| 7,042,032 B2 | 5/2006 | Lin et al. | |
| 7,045,368 B2 | 5/2006 | Hong et al. | |

(Continued)

FOREIGN PATENT DOCUMENTS
WO    WO 00/59051    10/2000

*Primary Examiner* — Harry W Byrne
(74) *Attorney, Agent, or Firm* — Saile Ackerman LLC; Stephen B. Ackerman

(57) ABSTRACT

Methods are presented for fabricating an MTJ element having a uniform vertical distance between its free layer and a bit line and, in addition, having a protective spacer layer formed abutting the lateral sides of the MTJ element to eliminate leakage currents between MTJ layers and the bit line. Each method forms a dielectric spacer layer on the lateral sides of the MTJ element and, depending on the method, includes an additional layer that protects the spacer layer during etching processes used to form a Cu damascene bit line. At various stages in the process, a dielectric layer is also formed to act as a CMP stop layer so that the capping layer on the MTJ element is not thinned by the CMP process that planarizes the surrounding insulation. Subsequent to planarization, the stop layer is removed by an anisotropic etch of such precision that the MTJ element capping layer is not reduced in thickness and serves to maintain uniform vertical distance between the bit line and the MTJ free layer.

27 Claims, 9 Drawing Sheets

U.S. PATENT DOCUMENTS

| | | |
|---|---|---|
| 7,067,866 B2 | 6/2006 | Shi |
| 7,241,632 B2 | 7/2007 | Yang |
| 7,426,096 B2 | 9/2008 | Shimazawa et al. |
| 7,723,827 B2 | 5/2010 | Katoh |
| 2004/0021189 A1* | 2/2004 | Yoda et al. .................. 257/421 |
| 2004/0127054 A1 | 7/2004 | Lee et al. |
| 2006/0220084 A1* | 10/2006 | Umehara et al. ............. 257/296 |
| 2007/0054450 A1 | 3/2007 | Hong et al. |

\* cited by examiner

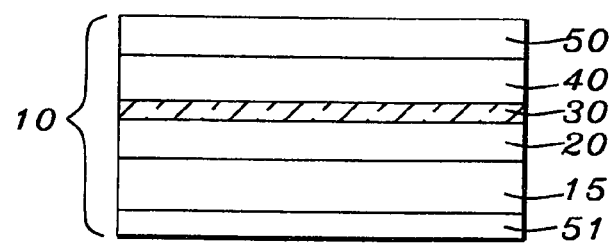
FIG. 1 - Prior Art
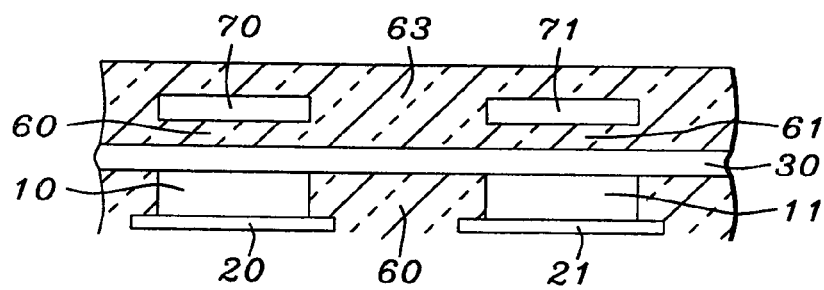
FIG. 2 - Prior Art
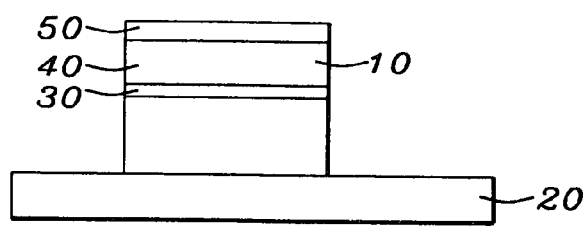
FIG. 3a - Prior Art

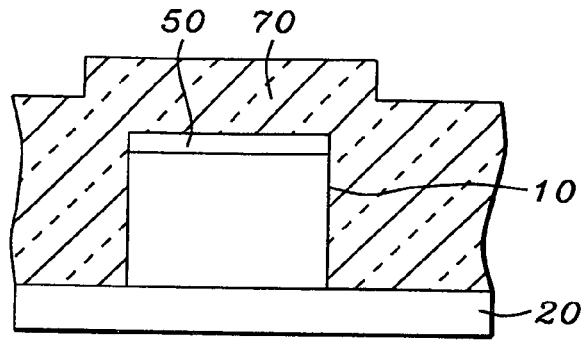
*FIG. 3b – Prior Art*
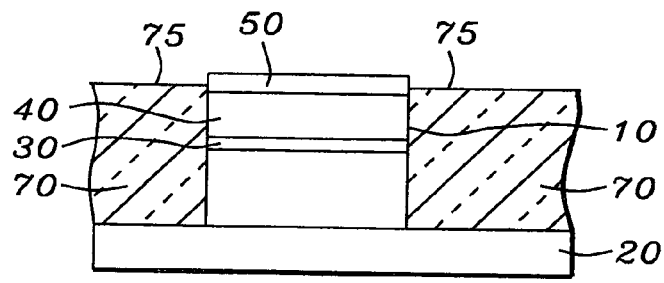
*FIG. 3c – Prior Art*
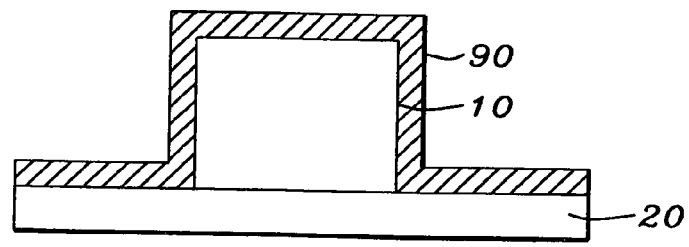
*FIG. 4a – Prior Art*

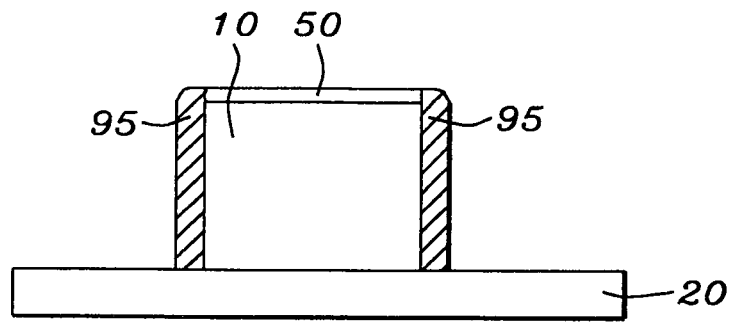
FIG. 4b - Prior Art
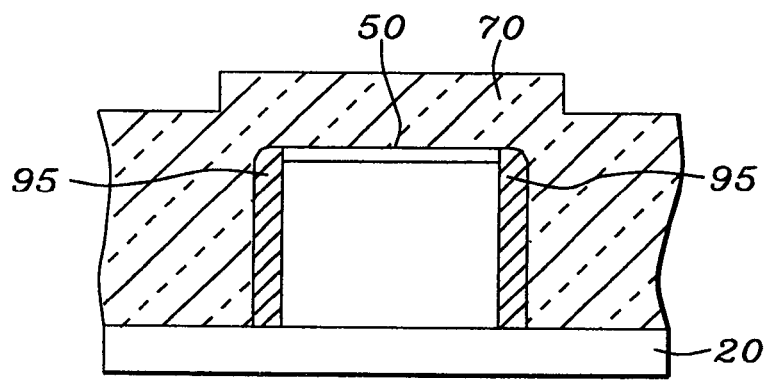
FIG. 4c - Prior Art
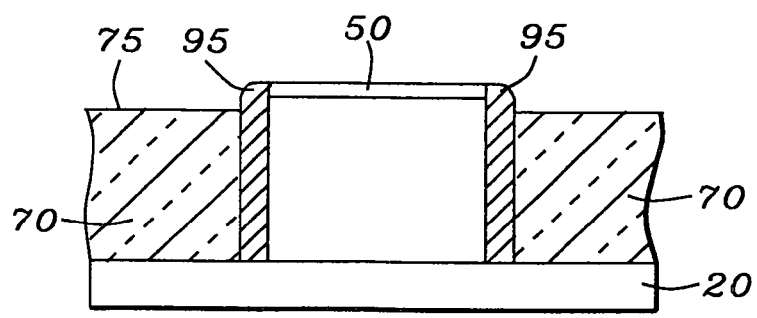
FIG. 4d - Prior Art

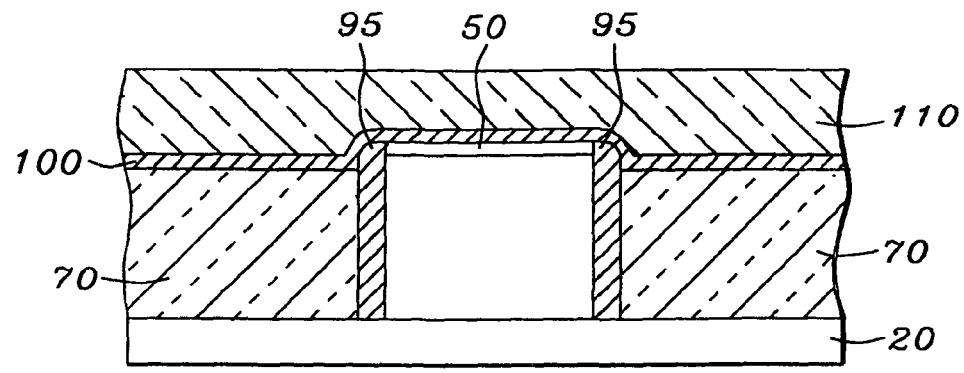
FIG. 4e — Prior Art
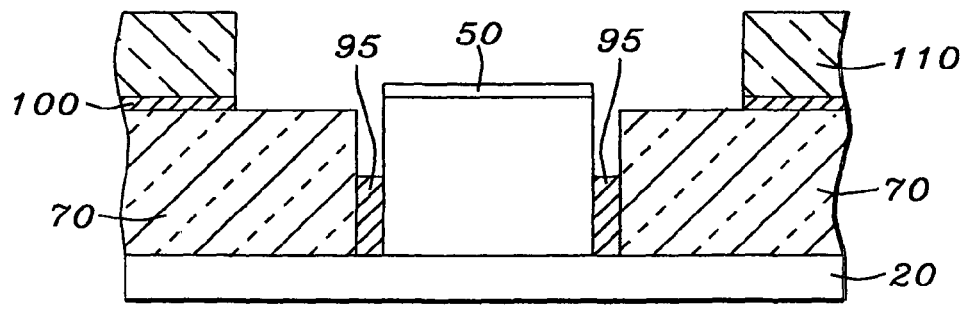
FIG. 4f — Prior Art
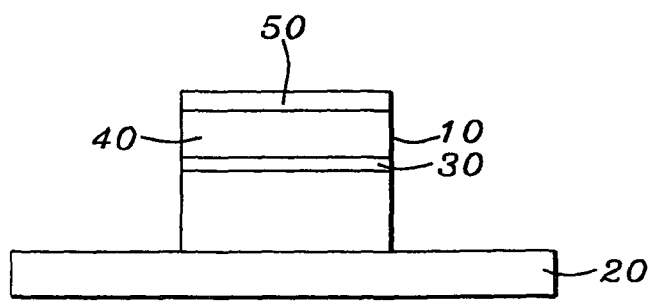
FIG. 5a

SPACER STRUCTURE IN MRAM CELL AND METHOD OF ITS FABRICATION

This is a Divisional Application of U.S. patent application Ser. No. 11/290,763, filed on Nov. 30, 2005, now U.S. Pat. No. 7,880,249 which is herein incorporated by reference in its entirety, and assigned to a common assignee.

RELATED PATENT APPLICATIONS

This Application is related to Application No. HT 05-003, Ser. No. 11/106,320, Filing Date, Apr. 14, 2005, now issued as U.S. Pat. No. 7,241,632 and to Application No. HMG 05-012/016, Ser. No. 11/221,146, Filing Date, Sep. 7, 2005, now abandoned.

BACKGROUND OF THE INVENTION

1. Field of the Invention

This invention relates generally to a magnetoresistive random access memory (MRAM) cell formed in a magnetic tunneling junction (MTJ) configuration and particularly to a method of improving its coupling to an adjacent bit line.

2. Description of the Related Art

The magnetic tunneling junction (MTJ) device is a form of giant magnetoresistive (GMR) device in which the relative orientation of the magnetic moments of parallel, vertically separated, upper and lower magnetized layers controls the flow of spin-polarized electrons tunneling through a very thin dielectric layer (the tunneling barrier layer) formed between those layers. When injected electrons pass through the upper layer they are spin polarized by interaction with the magnetic moment of that layer. The probability of such an electron then tunneling through the intervening tunneling barrier layer into the lower layer then depends on the availability of states within the lower electrode that the tunneling electron can occupy. This number, in turn, depends on the magnetization direction of the lower electrode. The tunneling probability is thereby spin dependent and the magnitude of the current (tunneling probability times number of electrons impinging on the barrier layer) depends upon the relative orientation of the magnetizations of magnetic layers above and below the barrier layer. The MTJ device can therefore be viewed as a kind of variable resistor, since different relative orientations of the magnetic moments will change the magnitude of a current passing through the device.

FIG. 1 is a schematic cross-sectional view of a typical MTJ layer structure (10) (hereinafter referred to as an MTJ element) formed in what is called a spin-filter configuration. In this particular form, the lower one of the two magnetized layers, now called a pinned layer, has the direction of its magnetic moment fixed in direction, while the magnetic moment of the upper or free layer remains free to move in response to external stimuli. Looking from the bottom up, the layer configuration includes a seed layer (5), that is used as a foundation on which to form successive overlayers. A layer of antiferromagnetic material, the AFM layer (15), is formed on the seed layer and will be used to pin the magnetic moment of the pinned layer by a form of magnetic coupling called exchange coupling. The lower, pinned layer (20) is a layer of ferromagnetic material formed on the AFM layer, or it can be a pair of ferromagnetic layers separated by a non-magnetic coupling layer. The tunneling barrier layer or junction layer (30) is then formed on the pinned layer, typically by first forming a layer of a metal such as aluminum (or magnesium) and then subjecting the metal to oxidation. The free layer (40) is a ferromagnetic layer that is then formed on the junction layer. Finally, a protective capping layer (50) is formed on the free layer. As will be discussed below, the capping layer, which is typically a layer of Ta, TaN, Ti or TiN, plays an important role when the MTJ devices are planarized to render their upper surfaces co-planar with surrounding insulation.

After the layers are formed, the device is subjected to external magnetic fields at various temperatures to produce the magnetic moments in the pinned and free layers. If the pinned layer is formed as a coupled pair of ferromagnetic layers, the annealing process can be used to produce antiparallel magnetic moments so that the pinned layer has a substantially zero total magnetic moment.

If the magnetization of the free layer is allowed to move continuously, as when it is acted on by a continuously varying external magnetic field, the MTJ device can be used as a read-head for sensing magnetic field variations produced by moving magnetically recorded media. If the magnetization of the free layer is constrained to move in only two directions, eg. parallel to or antiparallel to the magnetization of the pinned layer, then the MTJ device can be used as a memory device, called a magnetic random access memory device or MRAM. When used as an MRAM, the MTJ device provides only two resistance values, maximum resistance in the antiparallel orientations of the free and pinned layer magnetizations and minimum resistance in their parallel orientation. Thus, when the device is in one of its two resistance states it can be said to store a logical zero or one. By sensing the resistance state, the device is "read," and by changing the resistance state, the device is written upon. The writing of such a device is accomplished by its interaction with the magnetic fields of current carrying lines, called word lines and bit lines, that are vertically separated and typically pass above or below the MTJ device in mutually perpendicular directions.

FIG. 2 is a schematic cross-sectional view of two prior art MTJ devices and their associated word and bit lines. The devices (10) and (11) are not shown in their layered detail, but it can be assumed they are identical to the device in FIG. 1. On the bottom surface of each device there is an electrode (20) and (21), that is used to sense the resistance state of each device. A bit line (30) contacts the upper surface of each device and runs from left to right in the plane of the figure. A layer of insulation (60) surrounds the devices and also vertically separates the bit line (30) from the word lines, (70) and (71), that pass over the devices and are directed perpendicularly to the plane of the figure. The word lines are also separated from each other by layers of insulation (63). It is understood by those skilled in the art that these layers of insulation may be deposited prior to the formation of the word and bit lines and then the word and bit lines may be plated within channels or trenches formed in the insulation. Once the word and bit lines are formed as shown in this figure, the passage of currents through them will produce magnetic fields that change the direction of the magnetic moment of the free layer within the MTJ devices. While in FIG. 2 word lines are shown above the MTJ elements, in some other configurations word lines are formed beneath the MTJ elements. In some configurations bit lines do not touch the upper surfaces of the MTJ elements and separate top electrodes are used for the reading operation.

To make dense arrays of MTJ devices and their associated word and bit lines, it is desirable to have a uniformly flat and co-planar topography in which the upper surfaces of the MTJ devices are exposed for making electrical contact and are co-planar with the insulation layers that are formed about them. The co-planarity of these layers is generally achieved by use of chemical mechanical polishing (CMP) processes.

Maintaining co-planarity of the device contact surfaces is of great importance because it will ensure that the distance from the bit lines to the free layers of all the devices is uniform, thereby also ensuring that currents in the bit lines will produce the same write fields at the free layers of each device. In addition, uniform smoothness of the insulation layers and their co-planarity with the exposed device surfaces will also eliminate leakage problems between the bit lines and the MTJ device. Unfortunately, prior art methods using CMP do not achieve the uniformity and co-planarity that is so desirable.

Referring now to FIGS. 3a-3c, there is shown a sequence of prior art processing steps that are typically used to render the upper surfaces of an array of MTJ devices co-planar with each other and with the surrounding insulation. For simplicity and attention to detail, the figures show only the process as applied to a single MTJ device, but the presence of an array of adjacent devices can be imagined.

Looking first at FIG. 3a, there is shown a cross-sectional side view of a patterned MTJ device (10) already formed on a bottom electrode (20). The tunneling barrier layer (30), the free layer (40) and the capping layer (50) are indicated for reference. It can be assumed that the MTJ device has been patterned as shown above to produce a final lateral width, W, by applying either an IBE (ion beam etch) or RIE (reactive ion etch) through a mask to remove unwanted side portions and that the mask has already been stripped away. It is well known in the art that IBE and RIE belong to a class of anisotropic etching processes, meaning that they etch preferentially in one direction (the vertical direction herein) rather than in the other direction (the horizontal direction herein). In the following process steps, such etches will be used and referred to specifically.

Referring now to FIG. 3b, there is shown the fabrication of FIG. 3a now including the additional formation of deposited layer of insulation (70), such as a layer of $SiO_2$, to cover all exposed surfaces of the MTJ device (10) as well as the upper surfaces of the bottom electrode (20).

Referring finally to FIG. 3c, there is shown the fabrication of FIG. 3b subsequent to a CMP process to remove insulation (70) from the upper surface of the device and surrounding regions and form what is intended to be a substantially smooth co-planar upper surface. As is shown schematically in the figure, however, the typical effects of such a CMP process is to remove so much of the insulation on either side of the MTJ device, that the upper insulation surface (75) is recessed relative to the exposed capping layer (50), which is also thinned. The degree of recession varies from device to device ranging to 400 angstroms and above. If the surrounding insulation material falls below the level of the barrier layer (30), the device will short out electrically due to current leakage between the layers below the barrier layer to the electrical lines subsequently formed above the device (and not shown here). Clearly, since the operation of an MTJ device depends on electron tunneling through the barrier layer, any direct leakage from the lateral side surfaces of the device to surrounding current-carrying lines would severely and adversely affect the device performance.

Other approaches have been tried, particularly approaches that involve forming additional capping layers over the patterned MTJ device before the final layer of insulation is applied. Although these approaches seem to have the advantage of providing an accurate spacing between the bit line and the free layer, they do not eliminate shorting from the sides of the MTJ device (see below) and, therefore, do not have the advantages of the present invention.

A particular prior art approach to the present problem uses silicon nitride (SiNx) layers to furnish additional protection. This approach is briefly summarized and illustrated very schematically in FIGS. 4a-4e. The method begins with the structure of FIG. 3a, a patterned MTJ device (10) formed on a bottom electrode (20). The MTJ device includes a tunneling barrier layer (30), a free layer (40) and a capping layer (50).

Referring next to FIG. 4a, there is shown, schematically, the fabrication of FIG. 3a, now including the formation of a thin layer (90) of silicon nitride ($SiN_x$) conformally covering the MTJ device (10) and the upper surfaces of the bottom electrode (20).

Referring next to FIG. 4b, there is shown, schematically, the fabrication of FIG. 4a wherein an anisotropic etching process, such as an IBE or RIE, has removed portions of the nitride layer laterally extending on the bottom electrode (20) beyond the MTJ device, leaving sidewalls (95) on both lateral side surfaces of the MTJ device Referring now to FIG. 4c, there is shown, schematically, the fabrication of FIG. 4b wherein a layer of insulation (70), such as a layer of $SiO_2$, is now formed conformally covering the upper capping layer (50) of the MTJ device, the sidewall (95) $SiN_x$ layers on the MTJ device as well as the surrounding lower electrode (20) surfaces. It is at this point that a CMP process is applied to remove excess insulation from the top of the MTJ device and the surrounding regions.

Referring now to FIG. 4d, there is seen a schematic drawing of the results of a CMP process to produce the desired smooth, planar upper surface in which the upper surface of the MTJ device is rendered substantially co-planar with the upper surface of the surrounding insulating material (70). As is shown in the figure, the CMP process is stopped by the sidewalls (95) and the MTJ capping layer (50) of Ta, Ti, TaN or TiN. The sidewalls (95) prevent exposure of the sides of the MTJ device even if the CMP process recesses the surface of the insulation layer (70) below the upper surface of the MTJ device.

Referring to FIG. 4e there is shown a subsequent process step that is preparatory to the formation of a conducting bit line (or other conducting electrode) over the top of the structure of FIG. 4d. Typically, the bit line is manufactured using a Cu damascene process in which a copper line is formed in a lined trench. To prepare for this, a layer of SiNx (100) is first deposited, followed by a thicker layer of $SiO_2$ (110). Trenches are then etched into these two layers and a layer of Cu, surrounded by adhesion/barrier layers (neither being shown) are formed in the trenches. During the etching of the SiNx layer (100) the SiNx sidewall layers (95) are also etched, leading to the disadvantageous formation shown in FIG. 4f.

Referring to FIG. 4f, there is shown the fabrication of FIG. 4e, wherein an etching of the $SiO_2$ (110) and SiNx (100) layers has also caused an etching and partial removal of the protective sidewall spacers (95) previously formed on the MTJ structure. The removal of the portions of the sidewall exposes the sides of the MTJ device to possible shorting, which the sidewall is originally meant to prevent.

Another approach is taught in related patent application HMG 05-012/016 and is fully incorporated herein by reference. In that process a SiNx capping layer is used to stop the CMP process.

Referring to FIG. 5a there is shown an MTJ device (10) identical to that in FIG. 3a. In FIG. 5b, the MTJ device of FIG. 5a is shown subsequent to the formation of a SiNx layer (120) conformally covering all exposed surfaces of the MTJ device as well as the bottom electrode (20) on which it is formed. Referring next to FIG. 5c, there is shown the fabrication of FIG. 5b subsequent to the formation of a layer of $SiO_2$ (125) to conformally cover the layer of SiNx (120).

Referring next to FIG. 5d, there is shown the fabrication of FIG. 5c subsequent to the application of a CMP process to remove SiO$_2$ material from the layer (125) on top of the device and stop at the SiNx layer (120). Because CMP removes SiNx at a slower rate than SiO$_2$, the SiNx layer will exhibit little or no recession of its surface (121), although the surrounding surface of the SiO$_2$ layer (126) may be recessed below the surface of the SiNx. Finally, referring to FIG. 5e, there is shown the removal of the SiNx layer (120) from the capping layer (50) by an IBE or RIE etching process, leaving the sidewall portion of the SiNx layer relatively intact. A top electrode can now be deposited directly on the capping layer of the MTJ device.

It is to be noted that the removal of the SiN$_x$ layer by an IBE or RIE, is a much more selective and controllable removal process than the CMP process. The basic idea in the method just described is to remove with great precision all of the SiN$_x$ spacer layer from over the Ta capping layer, thereby leaving the capping layer substantially unthinned from its original carefully controlled, as-deposited thickness. This method assures a uniform spacing between the upper bit line and the free layer, because it is only the capping layer that separates the one from the other. Unfortunately, as was seen in FIG. 4e, when the top electrode is to be formed by a Cu damascene process, the device is completely covered by additional SiNx and SiO$_2$ layers which must be etched. This etching will partially remove the desirable sidewalls protecting the MTJ device. Thus, even though the problem of uniform spacing between the bit line and the free layer is largely eliminated, the problem of shorting from the exposed sides of the MTJ device still remains.

All of the aforedescribed processes have the disadvantageous property of allowing the sides of the MTJ device to be exposed and, thereby, to allow shorting between MTJ layers and surrounding current carrying electrodes. The series of figures to be discussed below as FIGS. 6a-h, 7a-b and 8a-b will describe preferred embodiments of the present invention that will eliminate this shorting problem while still retaining the uniform spacing between the free layer and the conducting line formed above the cell element.

A search of the published prior art discloses several other patents and published applications that all teach an improvement of the interaction of MTJ elements and surrounding current carrying lines. Jones et al. (U.S. Pat. No. 6,555,858) teaches a flux concentrating scheme in which magnetic sidewalls are formed on current carrying lines. Kim et al. (U.S. Pat. No. 6,475,857) teaches a scalable device (a device that can be reduced in size while retaining advantageous coupling properties to word and bit lines). Kim et al. (U.S. Pat. No. 6,806,096), Grynkewich et al. (U.S. Pat. No. 6,881,351), Durlam et al. (U.S. Pat. No. 6,174,737), Grynkewich et al. (US Patent Application 2004/0205958) and Shi (US Patent Application 2004/0191928) all teach improved methods of masking dielectric and metal layers during the formation of MTJ elements and associated word and bit lines. None of these prior art references deal directly with the problem of shielding the MTJ element itself so that the planarization processes required to form uniformly flat topographies can work effectively and not lead to conditions that enhance the current leakage from the MTJ element to surrounding current carrying lines.

Accordingly, it is the object of the present invention to devise a novel process for rendering the upper surfaces of MTJ devices and surrounding insulation co-planar, while avoiding the difficulties just discussed in the creation of electrical short circuits as a result of current leakage between the MTJ device and surrounding current carrying lines.

SUMMARY OF THE INVENTION

A first object of this invention is to provide a method of planarizing the upper surface of a MTJ device and surrounding insulation so that the surfaces of the device and insulation are rendered smooth and co-planar.

A second object of the present invention is to provide a method of planarizing an array of MTJ devices and their surrounding insulation so that the resulting surface is smooth and co-planar.

A third object of the present invention is to provide a method of forming a smooth and co-planar upper surface for an array of MTJ devices and their surrounding insulation so that bit lines or other conducting electrodes formed on such planarized surface are formed at a uniform and well-controlled distance from the free layers of the MTJ devices.

A fourth object of the present invention is to provide a method of forming such a smooth and co-planar upper surface such that side portions of said MTJ devices are not exposed and thereby subject to the formation of electrical short circuits due to current leakage to current carrying conductors formed adjacent to them.

These objects will be met by two embodiments of a method of forming a smooth, co-planar upper surface for an array of MTJ devices and their surrounding insulation that includes the formation of leakage preventing dielectric (eg. SiO$_2$) spacers to eliminate electrical short circuits and the formation and use of CMP-stopping SiN$_x$ spacers to allow a uniform and well-controlled distance to be maintained between the MTJ devices and their associated bit lines during planarization processes. A first method, which constitutes a first embodiment of the present invention, forms an MTJ element in which a SiO$_2$ spacer layer is inserted between an SiNx layer and the MTJ sidewalls. This method is illustrated by FIGS. 6a-6h.

A first version of a second embodiment, illustrated by FIGS. 7a-7g provides a layer of SiNx that surrounds the MTJ element with an additional layer of dielectric material used to prevent current leakage from the MTJ to surrounding conductors.

A second version of a second embodiment, illustrated in FIGS. 8a-b, provides an alternative method of forming the required leakage preventing layer.

BRIEF DESCRIPTION OF THE DRAWINGS

FIG. 1 is a schematic representation of a prior-art MTJ MRAM device.

FIG. 2 is a schematic representation of a pair of MTJ MRAM devices and their associated bit and word lines as they would be fabricated using processes in accord with the prior art.

FIGS. 3a-c is a sequence of schematic representations showing a prior-art process flow to produce an MTJ MRAM element surrounded by insulation and having a substantially planar upper surface topography.

FIGS. 4a-f is a sequence of schematic representations showing a prior-art process flow, different from, but improved over, that in FIGS. 3a-c, to produce an MTJ MRAM element surrounded by insulation and having a substantially planar topography.

FIGS. 5a-e is a schematic representation of the process flow of another prior-art method of providing a smooth and co-planar surface for an MTJ MRAM element and surrounding insulation.

DESCRIPTION OF THE PREFERRED EMBODIMENTS

Each preferred embodiment of the present invention provides a method of fabricating an MTJ MRAM element or an array of such elements, including MTJ devices and associated word and bit lines, such that the upper surfaces of the MTJ elements and their surrounding insulation are smooth and co-planar, so that the spacing between the bit lines formed on said upper surface and the free layers within each MTJ element of the array is well-controlled and uniform and so that there is no leakage between the MTJ elements and associated current carrying conductors. The first embodiment of the invention involves the formation of $SiO_2$ sidewall spacers to prevent current leakage and $SiN_x$ spacers on the upper MTJ element surface to protect the capping layer from CMP thinning.

First Preferred Embodiment

Figure 6A:
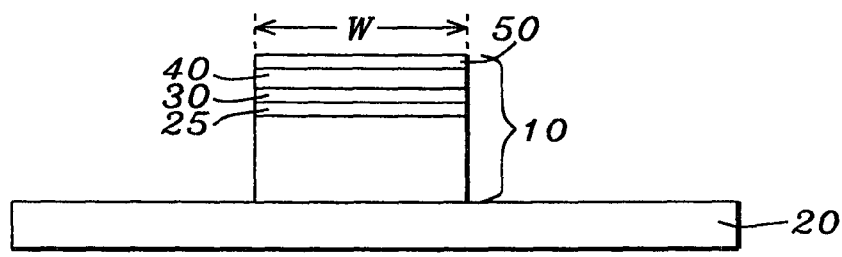
FIGS. 6a-h schematically illustrate the process flow of the first preferred embodiment of the present invention.

Referring first to FIG. 6a, there is shown, for clarity, a single, typical, horizontally layered MTJ element (10) formed on a bottom electrode (20) and shown (for simplicity) patterned to a common final lateral width, W, of all its layers. It is to be noted that the element need not have all its layers patterned to a common width; for example, the free (40) and pinned (25) layers may have different widths. The element, which is identical to that shown in FIG. 1, includes a tunneling barrier layer (30), such as a layer of oxidized aluminum or magnesium, a magnetically free layer (40), such as a layer (or layers) of ferromagnetic material formed on the barrier layer and an uppermost capping layer (50), such as a layer of Ta, TaN, Ti, or TiN, formed on the free layer. While this MTJ element is found in the prior art, the method of the present invention, to be described with reference to the following figures, is not limited to an element of this particular composition, although it is applied to it advantageously. It is noted that identical replicas of this MTJ element (10), when properly arranged spatially, would form an array of such elements suitable for an MRAM array and that the method of this invention, now to be described with respect to a single MTJ element, can be used in substantially identical fashion to fabricate the entire array.

Figure 6B:
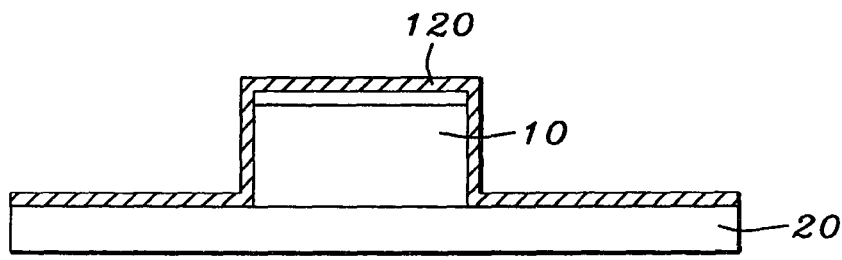

Referring now to FIG. 6b, there is shown schematically the fabrication of FIG. 6a wherein a thin first dielectric layer (120) has been formed to conformally cover all exposed surfaces of the MTJ element (10) and the upper surface of the bottom electrode (20). This layer can be a layer of $SiO_2$, SiC, AlOx or SiCN, formed to a thickness between approximately 50 and 300 angstroms.

Figure 6C:
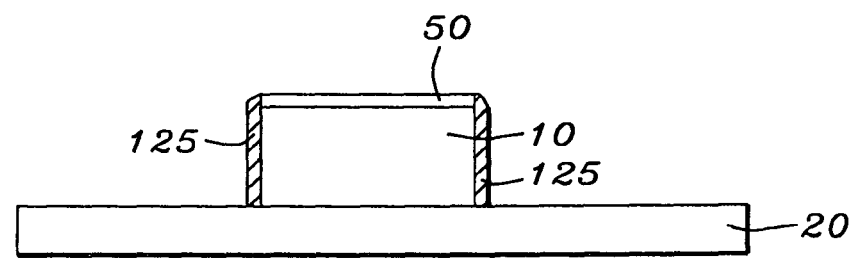

Referring next to FIG. 6c, there is shown the fabrication of FIG. 6b subsequent to a first anisotropic etch, such as an RIE, to remove those portions of the layer (120) on the upper surface of the MTJ element and laterally disposed on the bottom electrode (20) about the MTJ element and to leave remaining, thereby, only those portions of the original layer that abut the lateral sides of the MTJ element. These remaining portions of layer (120) now form sidewalls, denoted (125), contacting and abutting the lateral sides of the MTJ element.

Figure 6D:
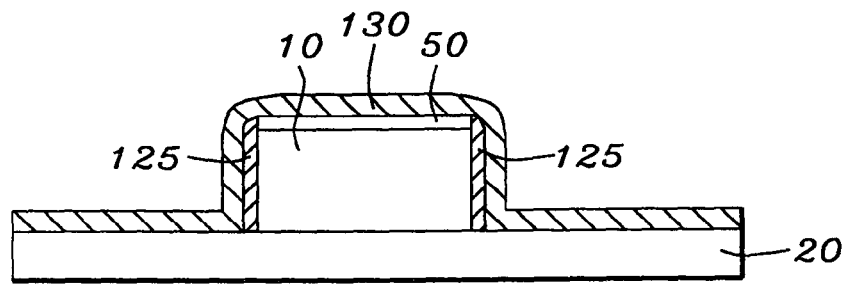

Referring next to FIG. 6d, there is shown the fabrication of FIG. 6c with the subsequent additional formation of a second dielectric layer (130) of $SiN_x$ or SiONx to a thickness between approximately 50 and 300 angstroms, to conformally cover the exposed surfaces of the fabrication. This second layer (130) will serve as the CMP stopping layer to assure a uniform distance between the bit line to be formed and the free layer of the MTJ element.

Figure 6E:
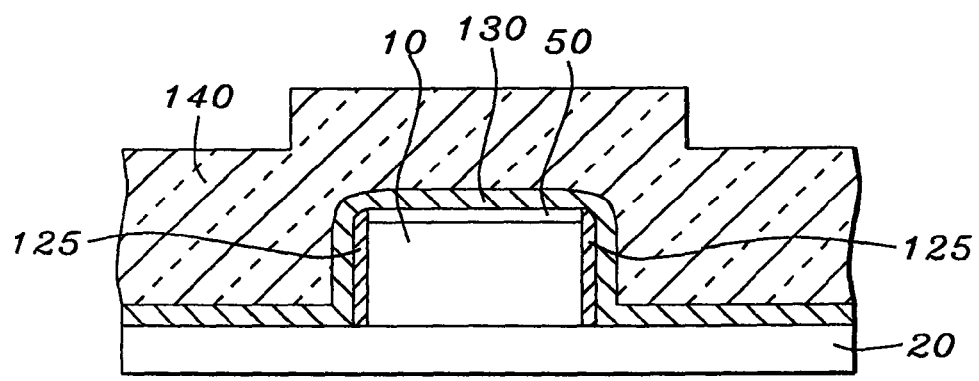
Figure 6F:
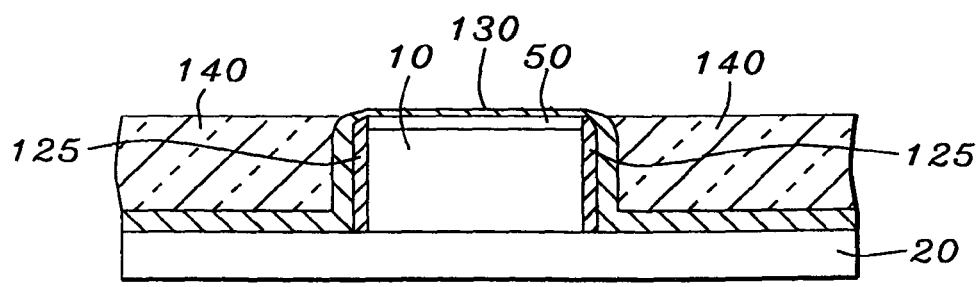

Referring next to FIG. 6e, there is shown the fabrication of FIG. 6d with the subsequent addition of a blanketing third dielectric layer (140), preferably of $SiO_2$ formed to a thickness between approximately 800 and 3000 angstroms, to conformally cover all exposed surfaces of the CMP stopping layer (130). This layer (140) is then planarized by a CMP process and the planarization stops within the upper horizontal portion of the CMP stopping layer (130), leaving a resulting exposed substantially planar surface as shown in FIG. 6f. It is noted that the CMP process will typically reduce the height of the blanketing layer (140) somewhat below the final height of the CMP stopping layer (130).

Figure 6G:
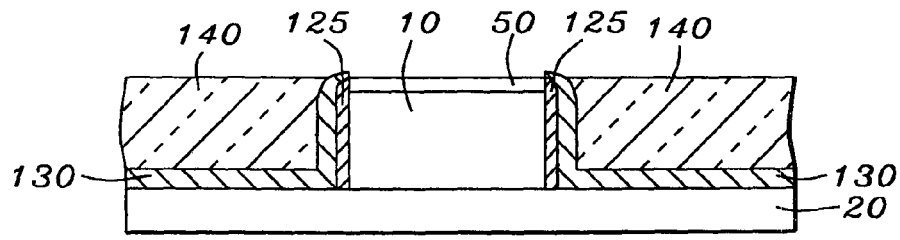

Referring next to FIG. 6g, there is shown the CMP planarized fabrication of FIG. 6f subsequent to a second anisotropic etching process, such as RIE, that precisely and completely removes the exposed portion of the CMP stopping layer (130). The etch process must be selective with respect to producing little removal of the first dielectric (eg. $SiO_2$, SiC, AlOx or SiCN) sidewall layer (125) compared to the nearly complete removal of the CMP stopping layer (130) that is formed preferably of SiNx or SiONx. On the other hand, the CMP process can remove portions of the CMP stopping layer, since the selective etch will carefully remove the remaining portions. As illustrated schematically in FIG. 6g, the upper surface of the MTJ element, its capping layer (50), has been exposed, but not thinned, by the etch process. Therefore, given the precise and controlled thickness of the capping layer, the vertical spacing between the MTJ element free layer and a subsequently formed conductor on the upper surface of the MTJ element, will be uniform. As is also seen in FIG. 6g, the resulting structure has two kinds of dielectric layers surrounding the MTJ element. The first dielectric layers are the sidewalls (125) formed of the first dielectric deposition that now abut the lateral sides of the MTJ element. The second dielectric layer is the remaining portion of the CMP stopping layer (130) that now abuts the first dielectric layers (125). These layers, abutting the lateral sides of the MTJ element will prevent any current leakage from the element to current carrying conductors, such as bit lines, subsequently formed above the element by the method illustrated in FIG. 6h described below.

Figure 6H:
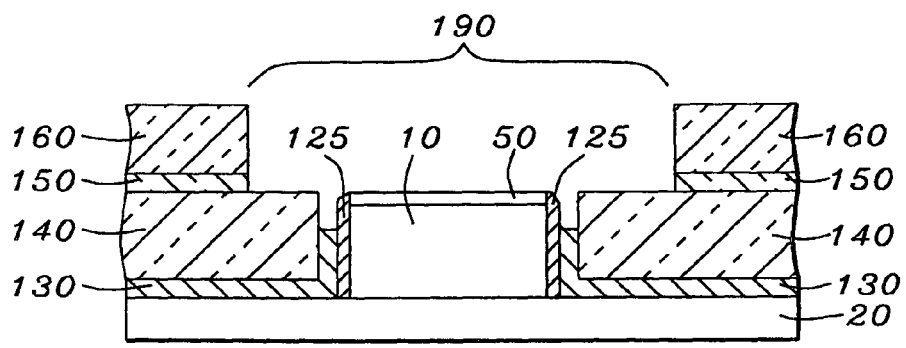

Referring now to FIG. 6h, the fabrication is then prepared for the formation of a Cu damascened electrode (eg. a bit line) by the additional formation of a thin layer of SiNx (150) on which is formed a thick layer of $SiO_2$ (160). The SiNx layer is formed to a thickness between approximately 200 and 1000 angstroms and the $SiO_2$ layer is formed to a thickness between approximately 1000 and 8000 angstroms. The formation of the Cu damascened conducting line will occur within a trench (190) formed within these layers (150) and (160) by etching processes that remove portions of those layers and stop at the upper surface of layer (140) and the upper surface (50) of the MTJ cell element. Note that the trench (190) is shown as already formed. Referring back to FIG. 4f there is shown the result of a similar trench formation in the context of the prior art process. In that process, the etching of the trench through the SiNx layer (layer (150) in this figure) also removed portions of the SiNx sidewalls surrounding the MTJ element (layer (95) in FIG. 4e), exposing the element sides to current leakage. As is seen in FIG. 6h, however, the etching of the trench when using the method of the present invention now may remove portions of the (SiNx or SiONx) CMP stopping layer (130), but it does not remove the sidewalls (125), because they are formed of dielectric material (eg. $SiO_2$) that has high etch selectivity relative to the stopping layer material.

It is to be noted that RIE etches suitable for achieving all the objects of the present invention in all of its preferred embodiments (above and below) are well known in the art. For example, a RIE with a fluorine-deficient fluorocarbon plasma without hydrogen, such as a $CF_4+C_2F_4$, $C_2F_6$ plasma or the like, has high $SiO_2$ to SiNx selectivity (i.e. it etches the $SiO_2$ more rapidly than the SiNx). On the other hand, a RIE with high SiNx to $SiO_2$ selectivity can be obtained using a chlorine based plasma or a fluorine rich plasma, or a bromine chemistry or a fluorine based plasma with oxygen.

Second Preferred Embodiment

The second preferred embodiment includes two versions, one of which is a continuation of the process steps already described and illustrated with respect to FIGS. 4a-4d of a prior art process and the other of which is a continuation of the process steps described and illustrated in FIGS. 5a-5e of a prior art process. In other words, the prior art process steps are carried out to a certain point and then the method of the second preferred embodiment replaces the remaining steps of the prior art process so as to achieve the objects of the present invention. The continuation of the process steps in accord with the second embodiment allows the formation of bit lines over the MTJ elements while not disturbing the lateral spacer layers already formed abutting the sides of the MTJ element. It is to be recalled that the prior art method leads to destruction of the spacer layers as a result of the formation of the Cu damascene bit lines.

Second Preferred Embodiment, First Version

As a first version of the second preferred embodiment, we shall refer to the prior art process partially described by FIGS. 4a-4d. FIG. 4d is now presented as the first process step in the first version of the second preferred embodiment of the present invention. All the process steps described and illustrated in FIGS. 4a-d have been carried out and the fabrication shown in FIG. 4d includes the MTJ element with capping layer (50), abutting sidewall spacers of SiNx or SiONx (95), formed to a thickness between approximately 50 and 300 angstroms, surrounded by a dielectric layer (70) formed to substantially the same height as the MTJ element. The upper surface of the dielectric layer (70) has been rendered substantially co-planar with both the upper edges of the sidewall spacers (95) and the exposed upper surface of the capping layer (50) by, for example, a CMP process.

Figure 7A:
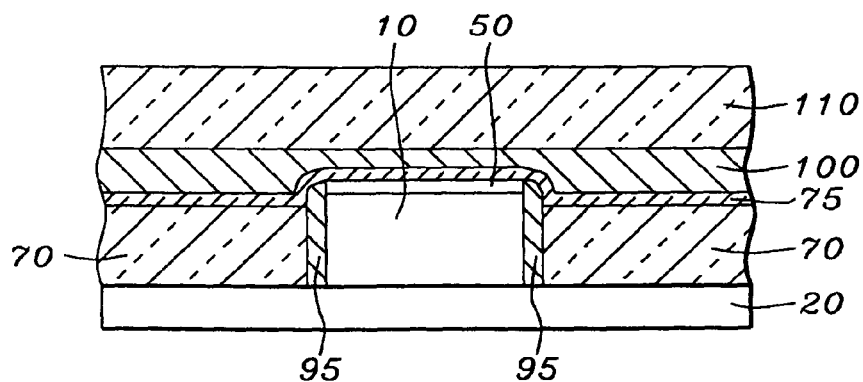
FIGS. 7a-b schematically illustrate the process flow of the first version of the second preferred embodiment of the present invention.

At this stage, the prior art process is abandoned and the next process step is a process step of the present invention that is illustrated and described with reference to FIG. 7a. Referring to FIG. 7a, there is shown the fabrication of FIG. 4d wherein the upper surface of the MTJ element and surrounding dielectric layer (70) has now been covered by a thin dielectric etch-stop layer (75), such as a layer of $SiO_2$, SiC, SiCN, AlOx or SiON, deposited to a thickness between approximately 20 and 200 angstroms. The fabrication is then prepared for the formation of a Cu damascened electrode (eg. a bit line) by the additional formation of a thin layer of SiNx (100) on which is formed a thick layer of $SiO_2$. The SiNx layer is formed to a thickness between approximately 200 and 1000 angstroms and the $SiO_2$ layer is formed to a thickness between approximately 1000 and 8000 angstroms.

Figure 7B:
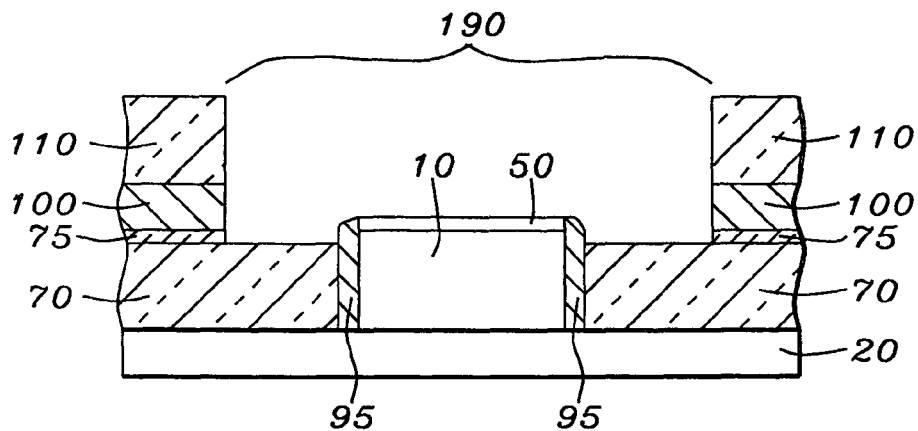

Referring next to FIG. 7b, there is shown schematically the results of a three step RIE etching process to produce a trench (190) in which to form the Cu damascene electrode. The first step of the RIE etching process is a first etching process characterized by a chemistry having a high $SiO_2$ to SiNx selectivity (as discussed above) resulting in complete removal of the $SiO_2$ layer (110) with little removal of the underlying SiNx layer. The second step of the RIE etching process is a second etching process that has a high selectivity of SiNx to the material of etch-stop layer (75) and removes the SiNx layer (100) with little disturbance to the etch-stop layer (75). The third step of the RIE etching process has a high etch selectivity for the material of the etch-stop layer (75) to the material of the sidewall spacer layer (95), so that the portion of layer (75) exposed at the trench bottom can be removed (note: layer (75) is shown removed) with little removal of the sidewall layer (95). Thus, the advantage of the etch-stop layer (75) is that it can be removed from the top of the MTJ element capping layer (50) without damaging the SiNx sidewall spacers (95), which remain to protect the MTJ element (10) from current leakage. In addition, the careful removal of the etch-stop layer allows the MTJ capping layer (50) to retain its as-deposited thickness, thereby preserving an exact distance between the MTJ free layer and the bit line above it.

Second Preferred Embodiment, Second Version

Figure 5B:
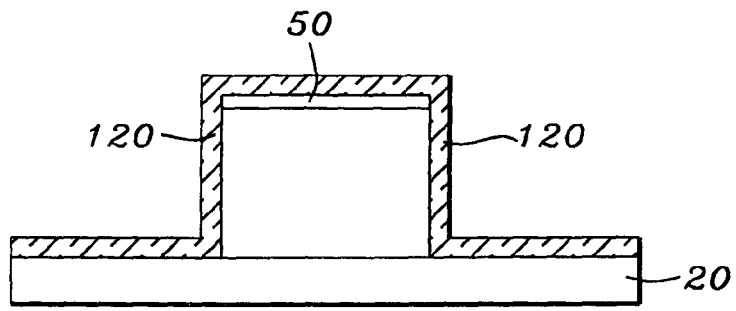
Figure 5C:
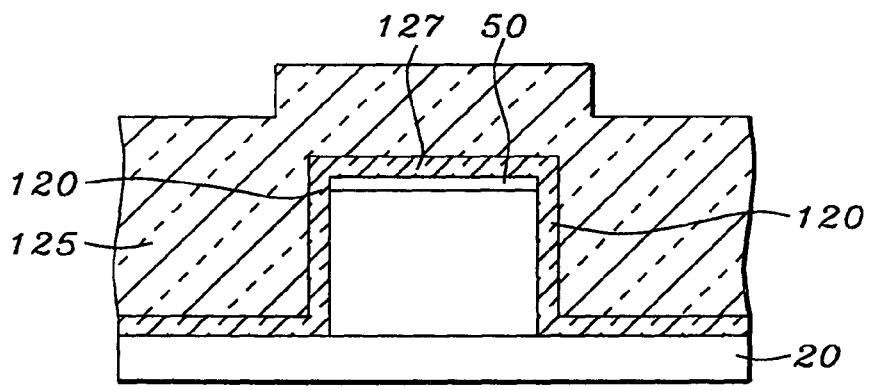
Figure 5D:
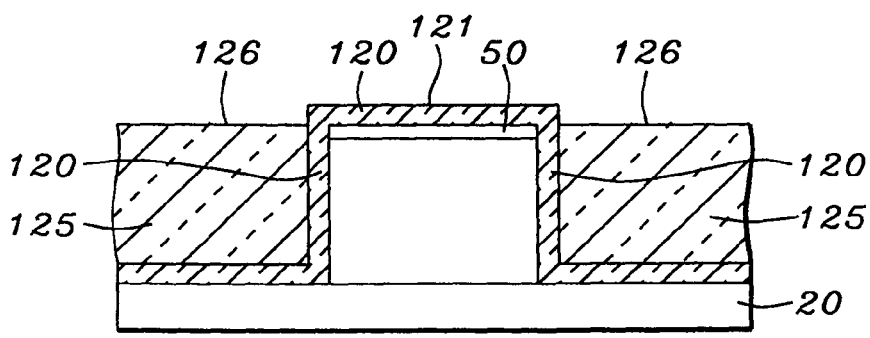
Figure 5E:
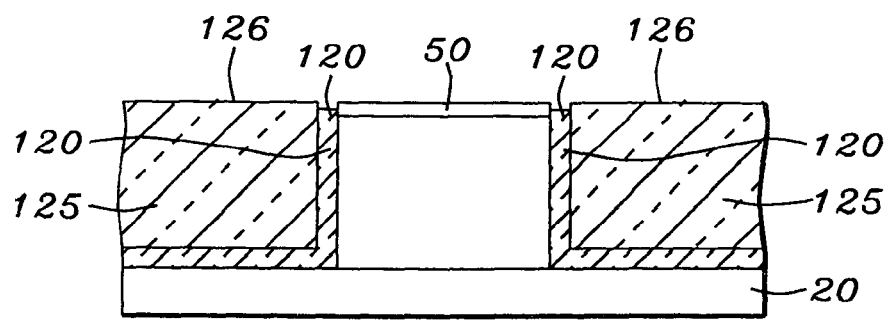

A second version of the second preferred embodiment begins with the fabrication illustrated and described by FIG. 5e. The prior art process steps illustrated and described by FIGS. 5a-5e have already occurred and the first process step of the present second preferred embodiment begins with the description of FIG. 8a.

Figure 8A:
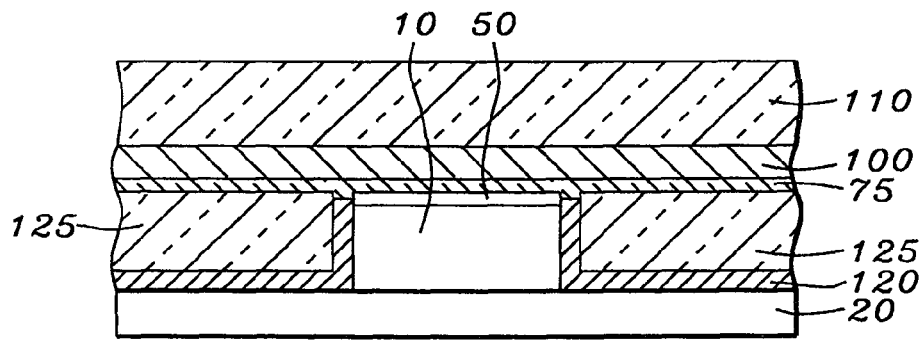
FIGS. 8a-b schematically illustrate the process flow of the second version of the second preferred embodiment of the present invention.

Referring to FIG. 8a, there is shown the fabrication of FIG. 5e wherein the upper surface of the MTJ element (10), the top edge of layer (120), which is a layer of SiNx or SiONx formed to a thickness between 50 and 300 angstroms and surrounding dielectric layer (125) has been covered by a thin dielectric etch-stop layer (75), such as a layer of $SiO_2$, SiC, SiON, SiCN or AlOx, deposited to a thickness between approximately 20 and 200 angstroms. The fabrication is then prepared for the formation of a Cu damascened electrode (eg. a bit line) by the additional formation of a thin etch-stop layer of SiNx (100) on which is formed a thicker layer of $SiO_2$ (110). The SiNx etch-stop layer is formed to a thickness between approximately 200 and 1000 angstroms and the $SiO_2$ layer is formed to a thickness between approximately 1000 and 8000 angstroms.

Figure 8B:
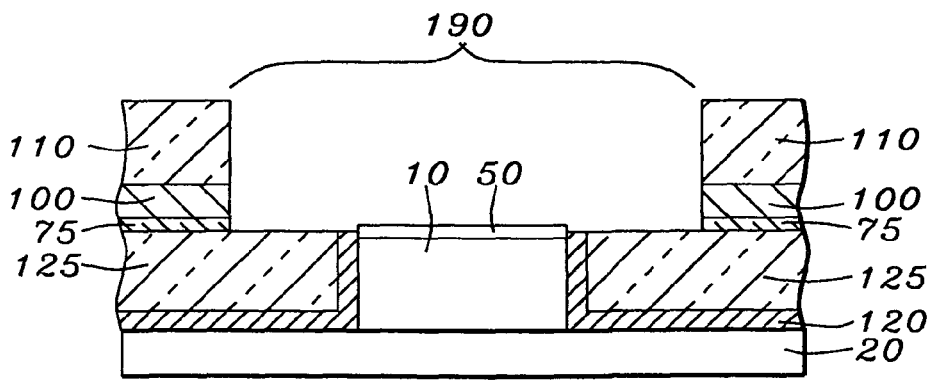

Referring next to FIG. 8b, there is shown schematically the results of a three step RIE etching process on the fabrication of FIG. 8a to produce a trench (190) in which to form the Cu damascene electrode. The first step of the RIE etching process is characterized by a chemistry having a high $SiO_2$ to SiNx selectivity resulting in complete removal of the $SiO_2$ layer (110) with little removal of the underlying SiNx layer (100). The second step of the RIE etching process has a high selectivity for SiNx to any of the materials of etch-stop layer (75) and removes the SiNx layer (100) with little disturbance to the etch-stop layer (75). The third etching process has a high selectivity for the materials of layer (75) to SiNx layer (120) (see the description in FIG. 5e), so that layer (75) is completely removed from the bottom of the trench with little removal of layer (120). As can be seen, the advantage of the etch-stop layer (75) is that it can be removed from the top of the MTJ element without damaging the SiNx layer (120) that abuts the lateral sides of the MTJ element. This portion of the SiNx layer remains to protect the MTJ element from current leakage.

The positioning of a bit line (30) on a planarized surface, such as that within the trench formed above, is shown in FIG. 2. Furthermore, as noted in the description of FIG. 8b above, the sidewall layer ((120) in FIG. 8b) also ensures the elimination of current leakages between the MTJ element and surrounding conductors. It is also to be noted from the structure of the two element array of FIG. 2, that a linear array including a plurality of MTJ elements, all formed and surrounded by planarized insulation, in the manner described above can be contacted on their upper surfaces by a single bit line or multiple bit lines and the bit lines will be at a uniform distance from the free layers in each MTJ element and the elements in the array will be protected from current leakage.

As is finally understood by a person skilled in the art, the preferred embodiments of the present invention are illustrative of the present invention rather than limiting of the present invention. Revisions and modifications may be made to methods, materials, structures and dimensions employed in forming and providing a MTJ MRAM device and an array of such devices having a uniform and precisely controlled spacing between associated conducting lines and electrodes and MTJ element free layers and wherein current leakages between said lines and electrodes and said elements are eliminated, while still forming and providing such a device and array of such devices and their method of formation in accord with the spirit and scope of the present invention as defined by the appended claims.

What is claimed is:

1. A method of forming an MTJ device comprising:
    providing a substrate;
    forming a patterned MTJ element on said substrate, said element having a capping layer with a planar, horizontal upper surface, said element having lateral side surfaces and said element including a free layer disposed beneath said capping layer and parallel to said upper surface; then
    forming a current leakage-eliminating layer abutting said lateral side surfaces.

2. The method of claim 1 wherein said current leakage-eliminating layer is formed by a method comprising:
    forming a first dielectric layer, conformally covering the horizontal upper surface and lateral side surfaces of said patterned MTJ element and also laterally disposed on said substrate;
    removing, by a first anisotropic etch process, said laterally disposed portions of said first dielectric layer and portions of said first dielectric layer covering the horizontal upper surface of the MTJ element, the remaining portions of said layer, thereby, forming spacer layers abutting and covering said lateral side surfaces of said MTJ element;
    forming a second dielectric layer, that is a CMP stopping layer, conformally over said first dielectric layer, a horizontal upper portion of said second dielectric layer covering the upper surface of said MTJ element, a vertical portion covering said spacer layers and a portion being laterally disposed horizontally on the substrate laterally disposed beyond said MTJ element; then
    forming a third dielectric layer, that is a blanket layer of insulation conformally over said second dielectric layer; then
    planarizing, using a process of CMP, an upper surface of said third dielectric layer, the CMP process stopping within said second dielectric layer to expose the upper portion of said second dielectric layer covering the upper surface of said MTJ element and partially covering upper portions of said spacer layers; then,
    removing exposed portions of said second dielectric layer, using a second anisotropic etching process, thereby exposing the upper surface of said MTJ element and not thinning said capping layer, thereby rendering the upper surface of said MTJ element substantially co-planar with said third dielectric layer upper surface while leaving vertical portions of said second dielectric layer and said spacer layers abutting lateral portions of said MTJ element and, thereby, protecting said element from current leakage.

3. The method of claim 1 further including the formation of a conducting bit line over said co-planar surface, the spacing between said bit line and said free layer thereby being uniform and there being no current leakage between said bit line and said lateral MTJ element side surfaces.

4. The method of claim 1 wherein said first dielectric layer is a layer of $SiO_2$, SiON, SiC, AlOx or SiCN formed to a thickness between approximately 50 and 300 angstroms.

5. The method of claim 1 wherein said second dielectric layer is a layer of SiNx or SiONx formed to a thickness of between approximately 50 and 300 angstroms.

6. The method of claim 1 wherein said third dielectric layer is a layer of $SiO_2$ formed to a thickness between approximately 800 and 3000 angstroms.

7. The method of claim 1 wherein said first anisotropic etch is an ion-beam etch (IBE) or a reactive ion etch (RIE) with a chemistry that removes the material of the first dielectric layer.

8. The method of claim 1 wherein said second anisotropic etch removes the material of the second dielectric layer while removing little of the first dielectric layer.

9. A method of forming an MTJ device comprising:
    providing a substrate;
    forming a patterned MTJ element on said substrate, said element having a capping layer with a planar horizontal upper surface, said element having lateral side surfaces and said element including a free layer disposed beneath said capping layer and parallel to said planar horizontal upper surface; then
    forming a leakage-eliminating spacer layer abutting said lateral side surfaces; then
    forming a conducting line over said MTJ element.

10. The method of claim 9 wherein said leakage-eliminating spacer layer is formed by a method comprising:
    forming a first dielectric layer, that is a leakage-eliminating layer, conformally covering the horizontal upper surface and lateral side surfaces of said patterned MTJ element and also laterally disposed horizontally on said substrate;
    removing, by a first anisotropic etch process, said laterally disposed horizontal portions of said first dielectric layer and portions of said first dielectric layer covering the horizontal upper surface of the MTJ element, the remaining portions of said layer, thereby, forming spacer layers abutting and covering said lateral side surfaces of said MTJ element;
    forming a second dielectric layer, that is a blanket layer of insulation, conformally over said upper portion of said MTJ element, said spacer layers and laterally disposed on said substrate; then
    planarizing, using a process of CMP, an upper surface of said second dielectric layer, the CMP process stopping at said spacer layers and exposing, but not reducing in thickness, said capping layer of said MTJ element.

11. The method of claim 9 wherein said conducting line is a Cu damascene bit line and it is formed over said MTJ element by a method comprising:
    depositing a third dielectric layer, that is an etch-stopping layer, conformally over the upper surface of said MTJ element, exposed portions of said spacer layers and the upper surface of said second dielectric layer, then
    forming a SiNx layer on said third dielectric layer; then forming a SiO₂ dielectric layer on said SiNx layer; then
forming a trench within said SiNx and SiO₂ layers by a process further comprising:
 etching, using a second selective, anisotropic etching process, a trench in said SiO₂ layer to expose said SiNx layer; then
 etching, using a third selective, anisotropic etch process, through said SiNx layer and stopping within said third dielectric layer, thereby preventing damage to said spacer layers; then
 etching and removing, using a fourth, selective anisotropic etch process, said third dielectric layer exposing, thereby, the upper horizontal planar surface of said capping layer of said MTJ element but not reducing said capping layer in thickness; then
 forming a Cu damascene bit line within said trench.

12. The method of claim 9 wherein said first dielectric layer is a layer of SiNx or SiONx formed to a thickness between approximately 50 and 300 angstroms.

13. The method of claim 9 wherein said second dielectric layer is a layer of SiO₂ formed to a thickness between approximately 800 and 3000 angstroms.

14. The method of claim 9 wherein said third dielectric layer is a layer of SiO₂, SiC, SiON, SiCN or AlOx formed to a thickness between approximately 20 to 200 angstroms.

15. The method of claim 10 wherein said first etching process is an RIE etch that removes SiNx or SiONx.

16. The method of claim 11 wherein said second etching process is an RIE etch having a chemistry that removes the SiO₂ layer preferentially to the SiNx layer.

17. The method of claim 11 wherein said third etching process is a RIE etch having a chemistry that removes SiNx preferentially to the material of the third dielectric layer.

18. The method of claim 11 wherein said fourth etching process removes the material forming the third dielectric layer preferentially to the material forming the first dielectric layer.

19. The method of claim 9 wherein said leakage-eliminating spacer layer is formed by a method comprising:
 forming a first dielectric layer, that is a leakage-eliminating layer, conformally covering the horizontal upper surface and lateral side surfaces of said patterned MTJ element and also laterally disposed on said substrate;
 forming a second dielectric layer, that is a blanket layer of insulation, conformally over said first dielectric layer; then
 planarizing, using a process of CMP, an upper surface of said second dielectric layer, the CMP process stopping at and exposing the portion of said first dielectric layer covering the horizontal upper surface of said MTJ element; then
 removing, by an anisotropic first etch process, said exposed portion of the first dielectric layer, exposing the upper horizontal planar surface of said capping layer of said MTJ element but not reducing the thickness of said capping layer, whereby the remaining portion of said second dielectric layer includes said portion that covers the lateral sides of the MTJ element, forming, thereby, a leakage-eliminating spacer layer.

20. The method of claim 19 wherein said conducting line is a Cu damascene bit line and it is formed over said MTJ element by a method comprising:
 forming a third dielectric etch-stopping layer conformally over the upper horizontal surface of said MTJ element, and the upper planarized surface of said second dielectric layer, then
 forming a SiNx layer on said etch-stopping layer; then
 forming a SiO₂ dielectric layer on said SiNx layer; then
 forming a trench within said SiNx and SiO₂ layers by a process further comprising:
  etching, using a second selective, anisotropic etching process, a trench in said SiO₂ layer to expose said SiNx layer; then
  etching, using a third selective, anisotropic etch process, through said SiNx layer and stopping within said third dielectric layer, thereby preventing damage to said spacer layers; then
  etching and removing, using a fourth, selective anisotropic etch process, said third dielectric layer exposing, thereby, the upper horizontal planar surface of said capping layer of said MTJ element but not reducing said capping layer in thickness; then
  forming a Cu damascene bit line within said trench.

21. The method of claim 19 wherein said first dielectric layer is a layer of SiNx or SiONx formed to a thickness between approximately 50 and 300 angstroms.

22. The method of claim 19 wherein said second dielectric layer is a layer of SiO₂ formed to a thickness between approximately 800 and 3000 angstroms.

23. The method of claim 19 wherein said third dielectric layer is a layer of SiO2, SiC, SiON, SiCN or AlOx formed to a thickness between approximately 20 to 200 angstroms.

24. The method of claim 19 wherein said first anisotropic etch process is an RIE etch having a chemistry that removes SiNx or SiON.

25. The method of claim 20 wherein said second anisotropic etch process is an RIE etch having a chemistry that removes SiO₂ preferentially to SiNx.

26. The method of claim 20 wherein said third etching process is a RIE etch having a chemistry that removes SiNx preferentially to the material forming the third dielectric layer.

27. The method of claim 20 wherein said fourth etching process is an RIE etch that removes the material forming the third dielectric layer preferentially to the material forming the first dielectric layer.

* * * * *